United States Patent
Saunders et al.

(10) Patent No.: US 8,073,524 B2
(45) Date of Patent: Dec. 6, 2011

(54) CONTROL OF MAGNETIC FIELD HOMOGENEITY IN MOVABLE MRI SCANNING SYSTEM

(75) Inventors: John K. Saunders, Winnipeg (CA); Lindley Ward, Winnipeg (CA); Gordon Scarth, Winnipeg (CA)

(73) Assignee: Imris Inc., Winnipeg, Manitoba (CA)

( * ) Notice: Subject to any disclaimer, the term of this patent is extended or adjusted under 35 U.S.C. 154(b) by 838 days.

(21) Appl. No.: 11/936,881

(22) Filed: Nov. 8, 2007

(65) Prior Publication Data

US 2009/0124884 A1   May 14, 2009

(51) Int. Cl.
*A61B 5/05* (2006.01)
(52) U.S. Cl. ...................................................... 600/410
(58) Field of Classification Search ................... 600/410; 324/320
See application file for complete search history.

(56) References Cited

U.S. PATENT DOCUMENTS

| 5,735,278 | A | 4/1998 | Hoult et al. |
| 6,433,550 | B1 | 8/2002 | Kinanen |
| 6,819,108 | B2 * | 11/2004 | Huang et al. ................... 324/320 |
| 7,535,231 | B2 * | 5/2009 | Dewdney et al. ............. 324/320 |
| 2001/0048306 | A1 | 12/2001 | Mueller et al. |
| 2005/0154291 | A1 | 7/2005 | Zhao et al. |
| 2008/0281181 | A1 * | 11/2008 | Manzione et al. ............ 600/407 |
| 2008/0312526 | A1 * | 12/2008 | Gagnon et al. ................ 600/411 |
| 2010/0235994 | A1 * | 9/2010 | Wedeleit et al. .................. 5/601 |

FOREIGN PATENT DOCUMENTS

| EP | 1845387 | 10/2007 |
| WO | WO 2004111671 | 12/2004 |
| WO | WO 2006097864 | 9/2006 |

* cited by examiner

*Primary Examiner* — Jacqueline Cheng
(74) *Attorney, Agent, or Firm* — Adrian D. Battison; Ade & Company Inc

(57) ABSTRACT

A patient imaging system includes a patient support table and an MRI system including a cylindrical magnet. The magnet defines a cylindrical bore for receiving the patient on the table where the magnet is mounted for rotation about a vertical axis on a slew ring carried on rails allowing longitudinal movement. The magnet is arranged in a two or three room diagnostic configuration in which a holding bay houses the magnet and the diagnostic patients are organized in the three rooms each cooperating with the magnet bay. A control system is provided for inputting data defining different locations or conditions of the magnet relative to its environment and for each of the different conditions data is stored defining a respective set of shimming parameters so that the control system automatically inputs the shimming parameters and adjusts the shimming as the magnet is moved or a secondary imaging system is brought up to the magnet.

3 Claims, 3 Drawing Sheets

CONTROL OF MAGNETIC FIELD HOMOGENEITY IN MOVABLE MRI SCANNING SYSTEM

This invention relates to an apparatus for obtaining medical scanned images of a patient including magnetic resonance images. The apparatus may provide the possibility for combining and sequencing both PET and MRI detection capability for surgical imaging applications. The apparatus may provide movement in both translational and rotational directions to optimize the utility and effectiveness of the system.

BACKGROUND OF THE INVENTION

A number of imaging systems are known including CT scanning, PET (Positron Emission Tomography) and MRI (Magnetic Resonance Imaging) which can be used to image the body.

With MRI, a high field magnet, typically superconducting, is arranged in a torus configuration (like a donut) and with the patient lying down inside the magnet the magnetic field allows a pulsed and sequenced magnetic and EM field to probe the body to produce soft tissue images, which allow the trained radiologist to determine with high probability the anatomy of the patient. MRI is sometimes performed using contrast agents to provide even better contrast between different soft tissue types. MRI techniques are very good at detecting the anatomical location of many but not all tumours.

These two imaging techniques, MRI and PET, and MRI and CT are orthogonal techniques, in that the detection technology can be constructed in such a way that it is unaffected by magnetic fields and the MRI system can be constructed to be unaffected by the other techniques. For this reason, if an integrated detector system can be constructed, then the two systems can be operated in parallel or almost parallel manners in both space and time to allow for improved and more complete detection of tumour locations within the body.

In order to carry out these dual imaging systems it is often necessary to move components of the system relative to the magnet. These may include the imaging systems themselves or components associated with the system such as a patient support or table.

Further, previous publications and patents have shown it is possible to move a high-field superconducting MRI system in translation.

In U.S. Pat. No. 5,735,278 (Hoult et al) issued Apr. 7 1998 is disclosed a medical procedure where a magnet is movable relative to a patient and relative to other components of the system. The moving magnet system allows intra-operative MRI imaging to occur more easily in neurosurgery patients, and has additional applications for liver, breast, spine and cardiac surgery patients. The magnet is at first some distance from the operating table, either in the side or back of the surgical room or perhaps within a holding bay area.

When imaging is required, the MRI magnet is advanced from its holding area and positioned in the imaging position over the table, images are taken and magnet is retracted to its holding area.

Thus the MRI system consists of the magnet; rails, installed on the site; and a magnet mover system, which consists of a magnet carriage, cable carrier, and mover control system.

In order for an MRI system to generate effective images it is necessary that the magnetic field within the target area is homogeneous. Adjustments to the system to achieve this homogeneity are known as shimming.

The computer system controlling imaging has an internal control protocol which carries out automatic fine tuning of the shimming. However this automatic control has limits of adjustability and it is necessary when installing the system to firstly carry out an installation shimming. Thus it is known that an MRI magnet is shimmed, relative to its location and the arrangement of magnetic material in the area around the magnet, by adding small pieces of magnetic material in very precise positions in between the gradient and the gradient shield. This passive shimming is complemented by resistive shimming which can be achieved by placing coils of the appropriate geometry immersed in liquid helium in the magnet as well as on the outside of the gradient assembly. The coils immersed in liquid helium are called cryo-shims and those attached to the gradients dynamic resistive shims. The homogeneity of the magnet can also be adjusted by placing constant current in the gradient coils and these are known as the gradient offset currents. The passive and cryo-shimming is carried out only one time for a particular site during installation. This is carried out by introducing a "shim rig" into the bore of the magnet which includes sensors responsive to the magnetic field at the locations in the bore and after that the automatic control protocol of the imaging system is relied upon to effect the fine adjustment necessary.

Up to now, therefore careful attention has been applied to maintaining the environment of the magnet constant so that there is no changes which would require re-shimming of the magnet.

SUMMARY OF THE INVENTION

It is an object of the present invention to provide an improved apparatus for obtaining medical scanned images of a patient including magnetic resonance images where the magnet environment can be changed by movement of the magnet and/or of components around the magnet.

According to a first aspect of the invention there is provided an apparatus for obtaining a scanned image of a part of a patient comprising:

a magnetic resonance imaging system for obtaining images of the part of the patient, the magnetic resonance imaging system comprising:

a magnet defining an imaging volume arranged such that the part of the patient is positioned in the volume so as to lie in the magnetic field of the magnet;

a radio frequency transmission and detection system for eliciting and detecting from the part of the patient nuclear magnetic resonance signals, in response to the magnetic field;

a control system for controlling and varying the magnetic field and for receiving the radio frequency transmissions for generating an image therefrom;

the control system having an input for varying shimming parameters of the magnet by which the magnetic field of the magnet is adjusted to be homogeneous throughout the volume;

the magnet being located in an environment including magnetic material which can affect the homogeneity of the magnetic field in the volume;

the magnet and the environment being arranged such that the relative positions thereof can be changed between a plurality of different conditions;

a control system for inputting data defining the different conditions and for each of the different conditions data defining a respective set of shimming parameters for that condition;

and a condition input system for inputting information defining a current selected condition such that the control system automatically inputs the shimming parameters and adjusts the shimming as the conditions are changed.

In one arrangement the magnet is itself movable between different locations and the plurality of different conditions are obtained by moving the magnet relative to its environment.

In this arrangement, the magnet may be moved during imaging or between images and each of a series of positions along the movement constitute the different conditions.

In one preferred arrangement, the magnet is associated with a plurality of different rooms in which it is used for imaging and the plurality of different conditions are obtained by moving the magnet into the different rooms with each room defining a respective one of the conditions.

In one or more of the rooms the magnet is associated with a patient table which contains magnetic material and the different conditions are constituted by different positions of the magnet relative to the table. Thus the relative movement of the table and the magnet in the room may lead to a plurality of separate conditions or simply the different conditions may be constituted by the presence or the absence of the table as the magnet moves between the rooms with and without the table. The table maybe an operating table for the patient for use in intra-operative scanning.

In another arrangement, the plurality of different conditions are obtained by moving the environment relative to the magnet, such as imaging components related to the imaging systems. In another particularly important embodiment, the movable components are constituted by a secondary imaging system which can be used in association with the magnetic resonance imaging system and the plurality of different conditions are obtained by moving the secondary imaging system relative to the magnet. Thus the position of the secondary imaging system at the magnet for use therewith or remote from the magnet leads to different requirements for shimming which are automatically stored and implemented as the different positions are adopted.

The shimming concerned as defined by the parameters is that by which the magnet is shimmed by placing constant gradient offset currents in gradient coils of the magnet and wherein the shimming parameters define the currents required for the gradient offset currents.

Preferably the condition input system for inputting information defining a current selected condition is automatic and includes sensors such as position sensors detecting the different conditions.

The problem is that the magnet moves to several locations for imaging and these locations may have different magnetic environments. The different magnetic environments will cause the homogeneity of the magnet to be different in these different environments resulting different image quality for each of the locations. Image quality must be maintained in all imaging locations and therefore it is necessary to be able to adjust the magnet field in each location. This adjustment of the magnetic field needs to be an automatic process to guarantee optimal image quality at all times.

In an arrangement of operating room and diagnostic room associated with the magnet there is an operating room table close to the magnet in the OR rooms but not in the DR room. The OR table does have an impact on the homogeneity of the magnet. The present invention allows the table to be manufactured with an increased content of magnetic material in the table and to achieve this there is provided a method for automatically shimming the magnet in multiple locations. This avoids the generally accepted wisdom where the table and other components are manufactured and arranged to minimize the effect on homogeneity and instead allows the construction and arrangement of the components to be optimized without concern for changes in homogeneity.

Thus the table can contain significant amount of magnetic material which is compensated for in the shimming process since this will be a multi room configuration. Instead of requiring imaging to be in a fixed position in the operating room with respect to the OR table, procedures can be adopted where the magnet is moved along the position for imaging different body regions and this will require the magnetic field homogeneity to be optimal for each position.

In addition, the system allows the possibility of imaging the patient with the magnet moving by providing real time homogeneity adjustment at different positions along the movement. This can in practice be obtained by predetermining a number of selected positions along the movement and for each of those positions providing the required set of parameters. The positions are selected so that in between those positions the automatic adjustment system of the conventional MRI system will provide the required adjustment. The positions can thus be spaced at distances determined by the amount of movement and thus the amount of change in magnetic environment which can be accepted before the automatic internal system can no longer cope. The magnetic environment has an impact on the homogeneity of the magnet and conversely the magnet has an impact on its local environment. The fact that the magnet moves compounds the problem and so there will be sites where it will be required to protect the local environment from the impact of the moving magnet.

The technique to shim for multiple locations concentrates on adjustments to the currents in the gradient offsets and the dynamic or second order resistive shims. Once the passive and cryo-shims have been set for the site, the currents required for the gradient offsets and second order resistive shims must be determined for each location.

The automatic shim device for multiple locations is composed of a control computer, a sensing system for detecting the exact position of the magnet and/or the components relating to the magnet which affect the magnetic fields. Connections from the sensing system to the control computer which will then be connected to the MRI console computer. The sensing system sends a signal to the computer as to the status of the magnet with respect to position and if the magnet is in fact moving. If the magnet is moving then all aspects of the movement are transmitted to the control computer.

A computer program exists in the control computer such that the information from the sensing system are converted into current offsets for the gradient and the second order restive shim coils. These current offsets are transferred immediately to the MRI console computer to adjust the currents. Since some MRI equipment is controlled by FDA regulations the transfer and implementation of the current offset values is preferably achieved under appropriate security.

The adjustment of currents is completely transparent to the MRI technologist and does not involve any intervention on their part. If the host computer is under research mode then these currents may be introduced as part of the pulse program employed to control the MRI hardware. In sites where large in-homogeneities are detected in one location relative to another, these can be corrected by the strategic placement of magnetic material in one or more locations. The impact of the magnet on its environment will be minimized where needed by the strategic placement of steel plates either on the floor or in the wall as the situation dictates. This will include sites where the magnet is rotated.

The ability to attain very high homogeneity in all locations for a multi-location configuration is very important for image quality in these locations.

With this invention actual image quality can be improved. It can enable the surgeons to see finer structure. This invention may eliminate the need to place steel in the floor thus reducing (a) costs by about $30,000 and (b) subsequent hospital floor loading by 10,000 lbs. It may also enable the use of more metal in the OR table and in the combined Angio/OR table.

The system is installed in renovated hospital buildings or in new buildings. The system can be installed in one-room or two-room configurations. In the two-room configuration, the magnet and MRI system is shared between the two rooms as needed by the hospital staff, leading to increased cost effectiveness within the business case.

Many room configurations can be discussed with this concept. Many applications can also be discussed, with the applications being limited by the size and extension of the operating room table and the limitations of the MRI scanner.

In some regions and countries there is a premium placed on patient safety which disallows the movement of the patient after surgery has started. Therefore, any design of the scanner should move the scanner instead of moving the patient. This movement of the scanner could be in whole or in part, as long as the patient does not move. This same restriction on usage may eventually be true of interventional approaches, in that some interventional techniques require a significant number of penetrations of the body or aligned equipment items, which infer that patient movement should not be done.

Further, the MRI system has a magnetic field which is not equivalent in all directions with the magnetic field strength along the axis being different than in the two orthogonal directions. This means that the PET imaging portion of the system may be optimally sited on an off-axis orientation, which implies that rotation of the integrated scanner may be important.

The present arrangement moves the MRI in rotational and vertical directions as well to ensure that the integrated scanner is optimized.

The present arrangement assumes the presence of a scanner system that integrates both MRI and PET capability, and patents the movement of the integrated scanner in each of the six degrees of freedom of movement for the surgical, interventional and diagnostic imaging environments.

Additional unique multi-room layouts, configurations and applications are possible when a rotating MRI system is designed. In this case, the following multi-room configurations are used as examples to illustrate the variety of applications which are possible, with all of these applications being financially beneficial to the healthcare industry.

With these superconducting magnet systems, there are quench tubes, gradient cables, cooling cables of water and helium, and various control cables that need to be rotated as well. In addition, the rotation must be managed so that the rotation is 180 degrees in one direction and potentially 180 degrees in the other, if all 360 degrees of rotation is required.

The magnet system moves into a room within 1 minute, and the doors open within seconds, so the limiting factor on effectiveness of usage of the magnet system is providing the patients into and out of the room, prepping the patients if required, and discussing the imaging with the patients. It is known that a reasonable amount of time per imaging event is 60 minutes, and therefore the movement of the MRI scanner into and out of a room is not the limiting time value. As well, the efficiency of a multi-room system becomes more difficult to schedule as the need for both diagnostic and interventional procedures occurs. The following configurations are now possible:

A three room diagnostic configuration in which a central magnet holding bay houses the magnet and the diagnostic patients are organized in the three rooms. The doors to room one open, the magnet holding bay becomes part of room one, the magnet does not move but may extend its diagnostic table, the patient lies on the diagnostic table, imaging is performed, no need to do intervention is found, the patient exits the diagnostic table and the magnet moves back into the holding bay, ready for use by one of the other rooms. The magnet then may draw in its table, rotates to the doors for that room, and the process for the other room begins. In this case, the magnet does not move in a translational direction, such as on rails, but simply rotates.

A two room system which is in the corner of the hospital, in this case, the magnet both rotates and translates. There is a central magnet holding room, with doors in each of the two 90 degree directions, and the magnet can rotate its diagnostic table in whichever direction is required, or can rotate to allow the opposite end of the magnet to enter the room first. This approach allows existing diagnostic functionality and applications to be used in either room, or allows both rooms to serve as intra-operative rooms without any significant change to magnet controls and monitoring. This two room corner system cannot be done without a rotating magnet.

Similarly, any room configuration which is not of the in-line variety needs to have a rotating magnet.

In addition, in-line configurations can have increased flexibility as well if rotation is allowed. For example, one can join two diagnostic rooms with a magnet holding room in the middle. In this case, the MRI system rotates so that the diagnostic table is always the first entry into the room. This allows the diagnostic rooms to be as small as possible, allowing maximum density of the MRI system and the smallest cost in terms of square footage for the diagnostic room.

Many other room configurations can obviously be imagined for those skilled in the art of medical architecture and imaging systems.

DETAILED DESCRIPTION

The present description is partly taken from U.S. application Ser. No.: 11/765,845 filed Jun. 20, 2007 which corresponds to PCT International application Serial No: PCT/PCT/CA2007/001077 filed on the same date, the disclosure of which is incorporated herein by reference.

Reference is also made to the above United States patent of Hoult the disclosure of which is incorporated herein by reference.

Figure 1:
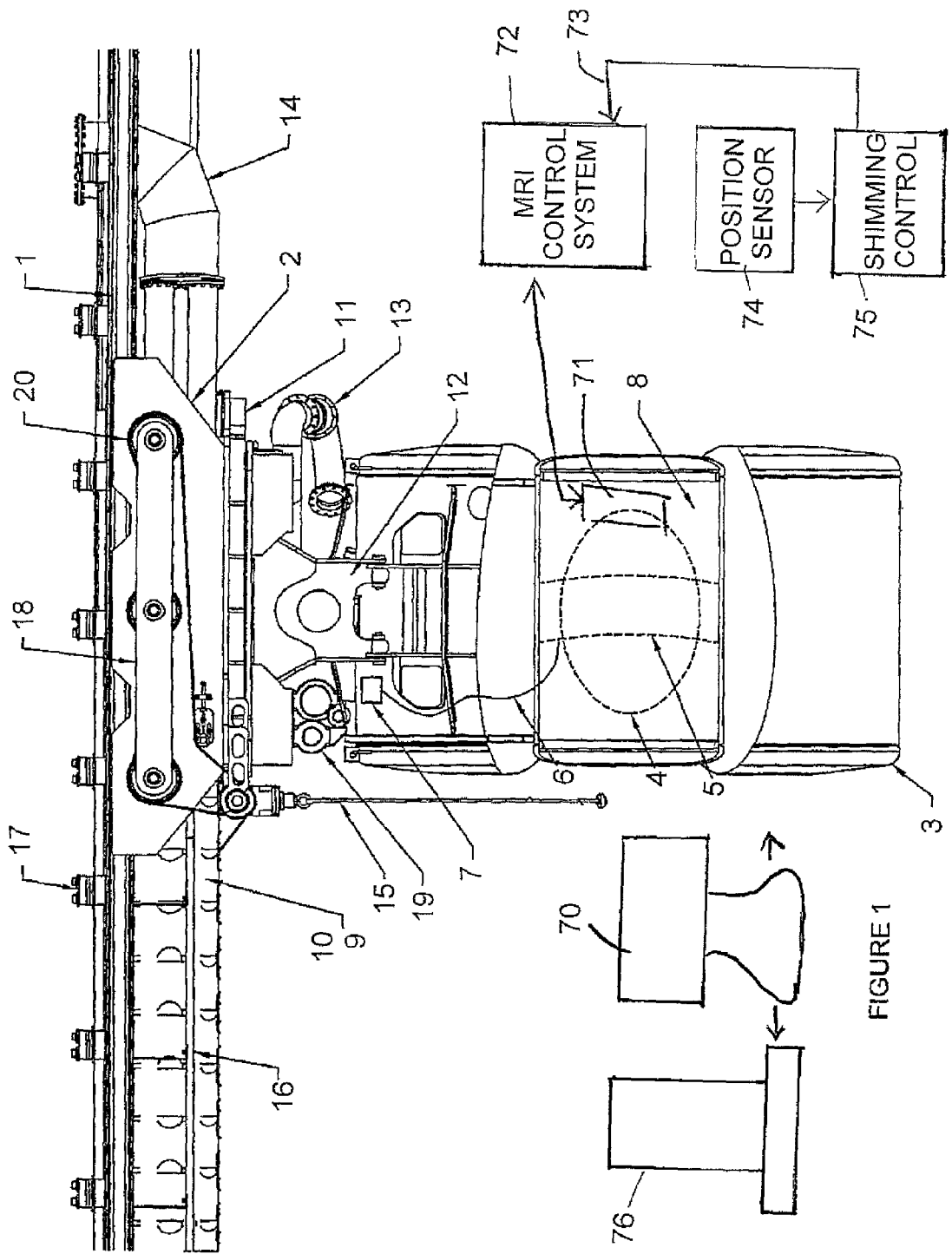
FIG. 1 is a side elevational view of an MRI magnet which includes the ability to move axially and to allow rotation about a vertical axis.

FIG. 1 shows the integrated MRI scanner with rotating capacity. Ceiling rails 1 are bolted onto the structural steel of the building using rail clamps 17. Two ceiling rails are used, at a width apart approximately the same as the width of the magnet, although other widths are possible.

The magnet 3 is mounted onto the rails using a magnet mover system 2. The upper part of the magnet mover system traverses the rails, and does not rotate. The lower part of the magnet mover system is connected to slew ring 11 so that it can rotate relative to the upper part. The slew ring 11 is motor driven, and carefully rotates the magnet system over a given angle, such as 90 degrees, 180 degrees or 270 degrees depending on the type of room layout being implemented. For both translational and rotational movements, the motor drive system can include gentle acceleration and deceleration in keeping with the requirements of the magnet system. The lower part of the magnet mover system is bolted to the magnet using the rotator to magnet system 12.

For the rotational magnet system using the slew ring 11, it is necessary to allow rotation of the quench tube system so there is provided a fixed quench tube 14 mounted on the rails 1 and a rotational quench tube part 13 attached to the magnet. These quench tubes are joined together with a rotary union mounted at the iso-center of the magnet system, directly above the magnet and central of the slew ring, so that the rotation does not put undue stresses on the quench system. As it is difficult to ensure that the exact iso-center is achieved, it is practical to use a flex connection that absorbs some portion of the stresses that occur during rotation.

For a rotational MRI system it is also necessary to ensure that the cabling can be properly guided through the rotational arc. One method to do this uses a cable management system 19 that contains multiple tube guides, with different guides being used for communication cabling, power cabling, low voltage cabling, monitoring cabling and helium lines. The separation of these cables and the guidance of these cables through the rotational movement ensures that no binding and eventual breakage occurs. Again these components pass through the slew ring and connect to components carried on the rails with the movement of the magnet by a cable carrier system 9.

The magnet mover system is moved via the belt drive translational system 18. This system uses wheels on top of the rail to carry the weight, and drive wheels 20 below the rail and contacted with the rail to allow movement to occur. Drive wheels and weight bearing wheels are placed on both of the rails, to ensure an even distribution of weight and a straight tracking performance for the system. A driveshaft may be used between the left and right belt drive translational systems to ensure that they move in harmony. In this case, a single motor may be used to drive both drive wheel sets. For safety, in the event of power outage, it is useful to have a hand crank 15 that allows the operators to remove the magnet from the patient if this movement is required. Operation of the hand crank requires the clutch to be disengaged in this particular design.

In addition to the translational movement provided by the rails and the rotational movement provided by the slew ring, vertical adjustment movement of the bore of the magnet is possible by adjustment of the height of the slew ring on the support 12.

The magnet has a round magnet bore 8 into which the table and patient can be positioned to allow imaging to occur. For a magnet such as the Siemens Espree (trade mark) magnet, the MRI bore is 70 cm in diameter and approximately 125 cm in length. The magnet has a field of view 4 of 30 cm×45 cm×45 cm. The field of view is the volume within the system that allows high quality imaging to occur, and coincides with the volume over which the magnet field can be maintained within appropriate linearity. The patient's anatomy of interest is positioned within the field of view to allow imaging to occur.

A PET detector ring 5 is co-located with the magnet field of view, with each individual detector on the ring being connected via optical fiber in a bundle of fibers 6 to the multipliers 7 that are located above or around the magnet. The multipliers are shown on the top of the magnet, however they could be placed in alternative positions within the magnet. The optical fiber is wound in the cable carrier 9 which typically carries magnet and associated cables 10 that include quench tube, helium lines, water coolant lines, gradient cables, RF cables, control lines, and a variety of additional monitoring and sensing lines as required for various applications that are attached to the bore, cover-set, and other MRI elements. The cable carrier and associated cabling uses the cable carrier guides 16 to maintain the correct shape of the cables as they are moved with the system.

Figure 2:
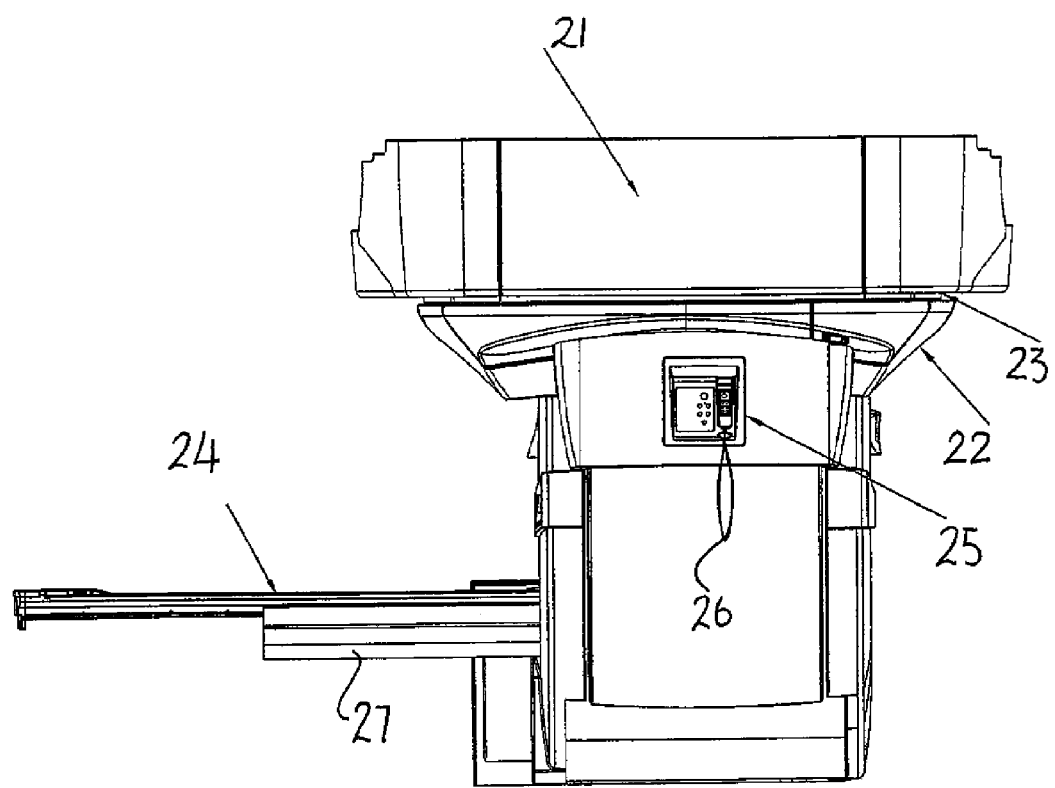
FIG. 2 is a side elevational view of the magnet of FIG. 1 showing further details of the covers and the diagnostic table which are omitted from FIG. 1 for convenience of illustration.
Figure 3:
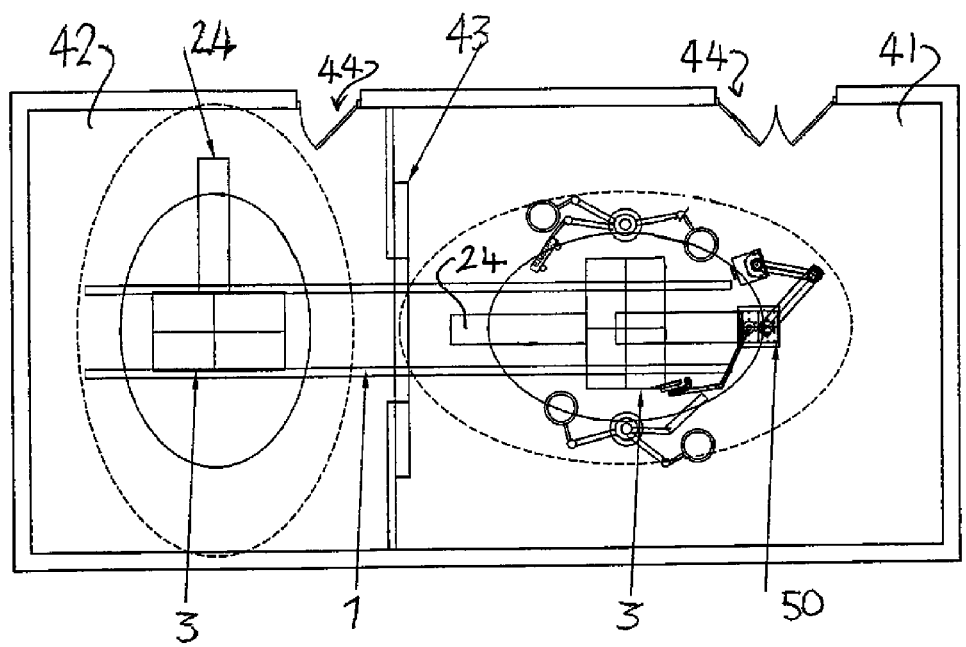
FIG. 3 is a schematic plan view of the magnet system of FIG. 1 mounted in a two room configuration and including a control system for the magnetic field homogeneity according to the present invention.

FIG. 2 shows a rotational MRI shielding cover-set. Conventional designs for such covers for magnets used in MRI are well known by persons skilled in the art. This cover-set is designed with an upper portion 21 which does not rotate and a lower portion 22 which does rotate, with the two portions being separated at a rotational seam 23.

FIG. 2 also shows a configuration which uses a diagnostic table 24 extending from the left side of the magnet. For the specific case of the Siemens Espree (trademark) magnet, the diagnostic table is attached to the magnet and can move in and out of the magnet for diagnostic imaging. The figure also shows the control panel 25 for the system. In this case, there is a set of controls installed on the magnet which includes a pendant control 26 connected to the magnet by a cable.

Figure 4:
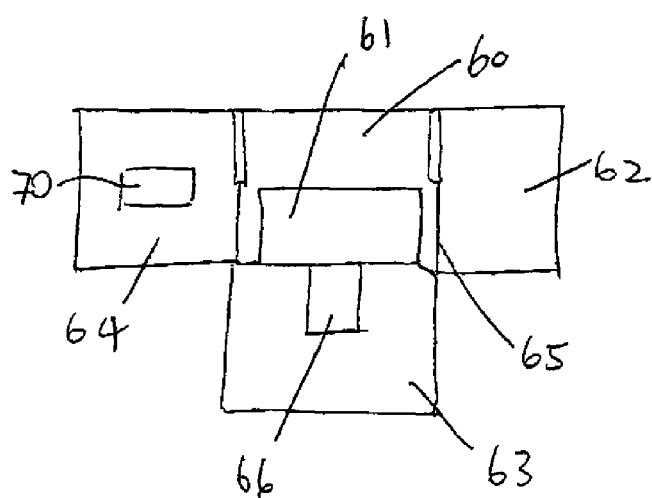
FIG. 4 is a schematic plan view of the magnet system of FIG. 1 mounted in a three room configuration.

FIG. 4 shows a floor layout in which the translating, rotating and vertically moving scanner is used in a two room configuration to service both an adult and a child. FIG. 4 shows a two room layout in which first room 41 is separated from second room 42 via sliding doors 23, with patients and medical team accessing the rooms via patient entry doors 44. The integrated scanner can move between these two rooms.

FIG. 4 shows two positions for this integrated scanner. The rails 1 allow the scanner to move between the rooms. The scanner position in room 41 is shown as it moves towards the surgical imaging position, in which the scanner 3 moves over the table 50 and in which the Siemens diagnostic table 24 is attached to the rear of the scanner as is the custom with the Siemens Espree (trademark), for example. This same scanner, when required, can be moved to a second position in room 42 in which the scanner 3 is rotated to allow the diagnostic table 24 to be positioned for interventional work. This rotation increases the utility of the system by minimizing the amount of space and access required in the second room 42.

FIG. 5 shows a three room diagnostic configuration in which a central magnet holding bay 60 houses the magnet 61 and the diagnostic patients are organized in the three rooms 62, 63 and 64. The doors 65 to one of the rooms 62, as selected from the three rooms, can be opened for example by retraction to one side so that the magnet holding bay becomes part of that room 62, the magnet does not move but may extend its diagnostic table 66, the patient lies on the diagnostic table, imaging is performed, no need to do intervention is found, the patient exits the diagnostic table and the magnet moves back into the holding bay, ready for use by one of the other rooms. The magnet then may draw in its table 66, rotates to the doors for that room, and the process for the other room begins. In this case, the magnet does not move in a translational direction, such as on rails, but simply rotates.

In an alternative arrangement, the magnet is mounted on a rail system along which can roll a support and on which is carried the slew ring allowing the magnet to rotate about its vertical axis. In this way the front face of the magnet can be moved to face the room. In this embodiment the patient table is located in the respective room so that the magnet moves to and relative to the table.

In addition, in-line configurations can have increased flexibility as well if rotation is allowed. For example, one can join two diagnostic rooms with a magnet holding room in the middle. In this case, the MRI system rotates so that the diagnostic table is always the first entry into the room. This allows the diagnostic rooms to be as small as possible, allowing maximum density of the MRI system and the smallest cost in terms of square footage for the diagnostic room.

There are advantages to simply hanging the MRI magnet from the ceiling. It is possible that vibration effects are reduced when the magnet is suspended, instead of floor mounted, leading to reduced vibrations and improved signal to noise performance.

It will be appreciated that the magnet may be arranged to carry a diagnostic table at one end such that on entry into a diagnostic room or on rotation of the magnet to co-operate with that diagnostic room, the table is made available for patients in that room. The magnet in a surgical situation is arranged to co-operate with a table 70 present in the room 64 which remains in the room when the magnet is moved so as to allow surgery to continue. In a hybrid situation, the magnet may carry the table at one end and be arranged to co-operate with a surgical table 70 at the other end, thus requiring rotation of the table about its vertical axis.

There may be a need for wall shielding, because when the magnet is rotated the field can go through the other side of the wall, impinging on hallways or other areas. The methods that can be used to limit this effect include: standard techniques that use additional metal in the walls to provide shielding, use of active coils embedded in the walls that turn on only when the rotational action occurs, power cycling of the MRI active coils, in which the active coils on the magnet either are increased or decreased in current so that the field does not extend so far.

The arrangement described herein provides the following features and advantages:

The use of the circular slew ring so that the magnet effects of the ring are homogenous during rotation, which allows for the minimum effect on the shimming software of the magnet.

For the Espree magnet, it is useful to pull in the diagnostic table prior to rotation, to allow for a minimum radius of rotation, a minimum strain on the rotating motor, and a maximum for operator safety. If the diagnostic table would extend further out of the magnet, it would increase the probability of collision between the operator and the rotating system, or the collision between the rotating system and equipment items inside the room.

To allow rotation, the cover-set of the magnet, along with the brackets that holds the cover-set onto the magnet provide an upper part of the cover-set which does not rotate and a lower part of the cover-set that does rotate with the magnet.

To optimize the rotational performance, there is provided a motor system that gently accelerates and decelerates in a programmed and programmable way. If the start and stop forces that are exerted on the magnet are excessive, vibration can be caused and potentially shorter life can occur.

To optimize the safety of the rotating system, the control system includes "lock-outs" that will not allow the rotation to occur unless the proper orientation, location, door condition or other specific conditions are met by the environment. This lock-out capability ensures that the magnet cannot be rotated if the environment is not ready to receive the rotation.

As is well known, the magnet defines an imaging volume 4 arranged such that the part of the patient on the table 24 or the table 70 is positioned in the volume so as to lie in the magnetic field of the magnet. A conventional radio frequency transmission and detection system 71 is provided for eliciting and detecting from the part of the patient nuclear magnetic resonance signals, in response to the magnetic field. A control computer including an operator interface is provided at 72 and contains the components well known to a person skilled in this art and this includes a control system for controlling and varying the magnetic field and for receiving the radio frequency transmissions for generating an image therefrom. The control system 72 has an input 73 for varying shimming parameters of the magnet by which the magnetic field of the magnet is adjusted to be homogeneous throughout the volume;

As explained previously the magnet is located in an environment including the tables and the rooms including magnetic material which affects the homogeneity of the magnetic field in the volume 4.

As explained previously the magnet and the environment are arranged such that the relative positions thereof can be changed between a plurality of different conditions.

A control system 75 is provided for inputting data into the control 72 defining the different conditions and for each of the different conditions data defining a respective set of shimming parameters for that condition.

A condition input system which is preferably an automatic sensing system 74 is provided for inputting information defining a current selected condition such that the control system automatically inputs the shimming parameters and adjusts the shimming as the conditions are changed.

In the example shown the plurality of different conditions are obtained by moving the magnet relative to its environment. Thus the magnet is moved during imaging relative to the table and each of a series of positions along the movement is sensed by the sensor 74. The magnet is associated with a plurality of different rooms in which it is used for imaging by moving the magnet into the different rooms with each room defining a respective one of the conditions which has different magnetic effect.

Also in FIG. 1 there is provided a secondary imaging system 76 such as a PET or CT scanning system which can be used in association with the magnetic resonance imaging system and is movable relative to the magnet. Thus the secondary system 76 can be moved from a first non-operating position remote from the magnet to a position immediately adjacent the magnet where simultaneous or related imaging can occur. The sensor 74 is also responsive to the position of the secondary imaging system and can thus input the relative locations of the components in the room and relative to each other. It will be appreciated that this sets up a series of different conditions of the components which may be simply two separate conditions in two separate rooms at its simplest to a very complex situation of different components moved to many different locations in each room. In each situation the shim rig is used to predetermine the shimming parameters required for that condition and these are stored in association with the location parameters of the condition in the shimming control computer for automatic supply to the conventional MRI control system.

The invention claimed is:

1. A method for obtaining an image by magnetic resonance imaging of a part of a patient comprising:
providing a plurality of imaging rooms including at least a first imaging room in which magnetic resonance imaging of a patient is carried out and a second imaging room separate from the first imaging room in which separate magnetic resonance imaging of a patient is carried out where only imaging by magnetic resonance imaging is carried out in the first and second rooms so that neither of the first and second imaging rooms contains a second imaging modality;

providing a magnetic resonance imaging apparatus comprising:

a magnet defining an imaging volume arranged such that the part of the patient is, during imaging, positioned in the volume so as to lie in the magnetic field of the magnet;

a radio frequency transmission and detection system for eliciting and detecting from the part of the patient nuclear magnetic resonance signals, in response to the magnetic field;

a control system configured to control and vary the magnetic field and to receive the radio frequency transmissions for generating an image therefrom;

a plurality of shimming coils mounted at the magnet so as to generate shimming fields which increase the homogeneity of the magnetic field within the imaging volume;

the control system having an input for entering a set of shimming currents of the shimming coils the magnet with the shimming coils being movable between the first and second rooms;

and a position input system for inputting into the control system an indication of a currently selected position of the imaging volume;

moving the magnet between the first and second imaging rooms so as to define first and second separate imaging positions wherein a first position is in the first room and a second position is in the second room;

in an initial step, at each of the first and second imaging positions, using a shim rig to generate a respective one of a plurality of sets of shimming currents for the shimming coils, wherein each set of the plurality of sets of shimming currents are set for the respective position;

wherein the plurality of sets of shimming currents for the shimming coils generated by the shim rig are selected to remove in-homogeneities resulting from magnetic in-homogeneities in the local magnet environment at the respective positions;

after the initial step, repeatedly moving the magnet to each of the first and second imaging positions as required and carrying out an imaging step at that imaging position of a part of a patient to generate an MR image;

the position input system having input the indication of the currently selected position; and the control system acting at each imaging step after the initial step, on receipt of the indication of the currently selected position of the magnet for the imaging step, to extract the respective set of shimming currents which is set in relation to that currently selected position and to apply to the shimming coils the extracted respective set of shimming currents for the currently selected position.

2. The method according to claim 1 wherein there is provided in the first room a first table for receiving a patient for imaging, wherein there is provided a second table for use in the second room for receiving a patient for imaging and wherein in the method the magnet is moved between the first imaging position in which a patient to be imaged is located on the first table in the first room and the second imaging position of a patient in the second room spaced from the first table.

3. A method for obtaining an image by magnetic resonance imaging of a part of a patient comprising:

providing a plurality of imaging positions including at least a first imaging position in which magnetic resonance imaging of a patient is carried out and a second imaging position separate and spaced from the first imaging position in which separate magnetic resonance imaging of a patient is carried out;

providing a first imaging table at the first imaging position for receiving a patient for imaging;

providing a second imaging table to be used at the second imaging position for receiving a patient for imaging;

where only imaging by magnetic resonance imaging is carried out in the first and second positions so that neither of the first and second imaging positions includes a second imaging modality;

providing a magnetic resonance imaging apparatus comprising:

a magnet defining an imaging volume arranged such that the part of the patient is, during imaging, positioned in the volume so as to lie in the magnetic field of the magnet;

a radio frequency transmission and detection system for eliciting and detecting from the part of the patient nuclear magnetic resonance signals, in response to the magnetic field;

a control system configured to control and vary the magnetic field and to receive the radio frequency transmissions for generating an image therefrom;

a plurality of shimming coils mounted at the magnet so as to generate shimming fields which increase the homogeneity of the magnetic field within the imaging volume;

the control system having an input for entering a set of shimming currents of the shimming coils;

the magnet with the shimming coils being movable between the first and second imaging positions;

and a position input system for inputting into the control system an indication of a currently selected position of the imaging volume;

moving the magnet between the first and second imaging positions;

in an initial step, at each of the first and second imaging positions, using a shim rig to generate a respective one of a plurality of sets of shimming currents for the shimming coils, wherein each set of the plurality of sets of shimming currents are set for the respective position;

wherein the plurality of sets of shimming currents for the shimming coils generated by the shim rig are selected to remove in-homogeneities resulting from magnetic in-homogeneities in the local magnet environment at the respective positions;

after the initial step, repeatedly moving the magnet to each of the of first and second imaging positions as required and carrying out an imaging step at that imaging position of a part of a patient to generate an MR image;

the position input system having input the indication of the currently selected position; and the control system acting at each imaging step after the initial step, on receipt of the indication of the currently selected position of the magnet for the imaging step, to extract the respective set of shimming currents which is set in relation to that currently selected position and to apply to the shimming coils the extracted respective set of shimming currents for the currently selected position.

* * * * *